United States Patent
Takatsuka et al.

[11] Patent Number: 6,121,113
[45] Date of Patent: Sep. 19, 2000

[54] METHOD FOR PRODUCTION OF SEMICONDUCTOR DEVICE

[75] Inventors: Hirotaka Takatsuka; Hiroyuki Ohta, both of Kanagawa, Japan

[73] Assignee: Fujitsu Limited, Kawasaki, Japan

[21] Appl. No.: 09/025,648

[22] Filed: Feb. 18, 1998

[30] Foreign Application Priority Data

Jun. 30, 1997 [JP] Japan .................................. 9-174568
Oct. 24, 1997 [JP] Japan .................................. 9-292792

[51] Int. Cl.⁷ .................................................. H01L 21/762
[52] U.S. Cl. .......................... 438/424; 438/427; 438/435; 438/692
[58] Field of Search ........................... 438/424, 427, 438/435, FOR 227, 692

[56] References Cited

U.S. PATENT DOCUMENTS 5,506,168  4/1996  Morita et al. .
5,521,422  5/1996  Mandelman et al. .
5,578,518  11/1996  Koike et al. .
5,834,358  11/1998  Pan et al. .
5,940,716  8/1999  Jin et al. .

FOREIGN PATENT DOCUMENTS 63-232349  9/1988  Japan .
64-21940   1/1989  Japan .

OTHER PUBLICATIONS

Pierre C. Fazan et al; IEEE 1993; pp. 57–60, IEDM 93.
C. Chen et al; IEEE 1996; pp. 837–840, IEDM 96.
B. Davari et al; IEEE 1988; pp. 92–95, IEDM 88.

*Primary Examiner*—George Fourson
*Attorney, Agent, or Firm*—Armstrong, Westerman, Hattori, McLeland & Naughton

[57] ABSTRACT

A method for the production of a semiconductor device comprises the steps of forming a stopper layer on a semiconducting substrate, forming a first opening part in the stopper layer thereby enabling the first opening part to establish an element separating area, etching the semiconducting substrate through the first opening part thereby forming a trench in the semiconducting substrate, partially etching the part of the stopper layer approximating closely to the trench thereby dilating the width of the first opening part, forming an oxide film on the stopper layer, in the first opening part, and inside the trench, removing the part of the oxide film rising above the stopper layer, removing the stopper layer, and contracting the lateral parts of the oxide film protruding from the trench.

16 Claims, 12 Drawing Sheets

METHOD FOR PRODUCTION OF SEMICONDUCTOR DEVICE

BACKGROUND OF THE INVENTION

1. Field of the Invention

This invention relates to a method for the production of a semiconductor device and more particularly to a method for the production of a semiconductor device possessed of an element separating area.

2. Description of the Prior Art

As one of the methods for element separation in a semiconductor device, the technique which is called LOCOS (local oxidation of silicon) is known. This technique consists in thermally oxidizing selectively a prescribed part of the surface of a silicon substrate by using a silicon nitride layer as a mask for preventing oxidation thereby forming an oxide layer which is used as an element separating area. The oxide layer which is formed in the element separating area is generally referred to as "field oxide layer."

The element separation according to the LOCOS technique, however, incurs the following two problems.

One of the problems resides in what is referred to as "bird's beak." It is a phenomenon such that the silicon substrate, on being thermally oxidized by the LOCOS technique, exposes the edge of the oxidation preventing mask thereof to the invasion by oxygen and consequently suffers a resultant oxide layer of the surface thereof to induce erosion beneath the oxidation preventing mask. The cross-sectional shape of the eroded part resembles the beak of a bird. This fact explains the designation "bird's beak."

Since this bird's beak results in expanding the field oxide layer, the dimensional dilation of the element separating area poses a problem.

The other problem resides in a phenomenon called "thinning effect." This phenomenon consists in the fact that the thickness of the field oxide layer decreases in accordance as the width of the element separating area decreases. This phenomenon arises from the fact that when the size of the opening formed in the oxidation preventing mask for the purpose of supplying oxygen to the element separating area of the silicon substrate is reduced, the amount of the oxygen supplied through the opening is decreased.

Though these problems have been heretofore known, neither the bird's beak nor the thinning produces very serious adverse effects so long as the element has a large size.

These problems gain in conspicuity, however, when not only the element but also the element separating area is miniaturized in consequence of the miniaturization of semiconductor devices.

Since the bird's beak is not easily reduced in size in concert with the miniaturization of the element, it erodes the element forming area and adds to the ratio of reduction of the size of the element forming area. When the width of the element separating area is reduced below 1 $\mu$m, the thinning effect gains in conspicuity and the thickness of the field oxide layer possibly decreases below one half of the thickness of the element separating area of a large width.

As the field oxide layer decreases in thickness as described above, the effect of the introduction of an impurity to directly below the field oxide layer for the purpose of preventing the formation of a channel in the parasitic MOS transistor possibly ceases to exist.

As an element separating structure which is incapable of incurring this problem, the structure produced by a method which comprises forming a trench in a silicon substrate and filling this trench with an insulating substance or polycrystalline silicon has been known. Though this method has been heretofore applied to the bipolar transistor LSI which is in need of a deep element separation, the application of this method to the MOS transistor LSI has been advancing because this method induces neither the bird's beak nor the thinning.

Since the MOS transistor LSI does not require such a deep element separation as is necessary for the bipolar transistor LSI, it adopts as a rule the structure called STI (shallow trench isolation) which effects the element separation with a trench of a relatively small depth approximating closely to 1 $\mu$m.

Next, the method for element separation by means of the STI will be described.

To begin with, a first thermal oxide layer 102 is formed in a thickness of 10 nm on a silicon substrate 101 and then a silicon nitride layer 103 is formed thereon in a thickness of 150 nm by the CVD technique as illustrated in FIG. 1A. Subsequently, an element separating area S is defined with a window 105 in a resist mask 104.

Thereafter, an opening part 103a is formed by etching the silicon nitride layer 103 and the first thermal oxide layer 102 under the window 105 and, at the same time, a trench 106 is formed in a thickness of about 0.5 $\mu$m in the silicon substrate 101 below the opening part 103a by the RIE (reactive ion etching) technique as illustrated in FIG. 1B.

Next, the resist mask 104 is peeled and then the inner wall of the trench 106 is thermally oxidized to form a second thermal oxide layer 107, 50 nm in thickness, along the inner wall as illustrated in FIG. 1C. Then, a silicon oxide layer 108, 1 $\mu$m in thickness, is formed throughout the overall area by the CVD technique to fill the trench 106 with the silicon oxide layer 108.

After an appropriate heat treatment, the silicon oxide layer 108 on the silicon nitride layer 103 by the CMP (chemical mechanical polishing) technique or the RIE technique such that this silicon oxide layer 108 remains inside and on the trench 106 as illustrated in FIG. 1D. In this case, the silicon nitride layer 103 is made to function as a CMP stopper layer.

Thereafter, the silicon nitride layer 103 is removed with phosphoric acid as illustrated in FIG. 1E. Subsequently, the first thermal oxide layer 102 on the silicon substrate 101 is removed with hydrofluoric acid.

Next, the surface of the silicon substrate 101 is thermally oxidized to form a third thermal oxide layer (not shown) on the whole surface. Then, an impurity is ion injected into part of the silicon substrate 101 and the injected impurity is thermally activated to form a well (not shown) in the silicon substrate 101. Thereafter, the third thermal oxide layer is removed with hydrofluoric acid.

Thereafter, the surface of the element forming area of the silicon substrate 101 is thermally oxidized to form a gate oxide layer 109, then a gate electrode 110 is formed on the gate oxide layer 109, and subsequently an impurity diffused layer 111 destined to give rise to a source and a drain is formed in the silicon substrate 101 on the opposite sides (in the perpendicular direction to the surface of the paper) of the gate electrode 110 as illustrated in FIG. 1F.

Incidentally, when the treatment with hydrofluoric acid which is performed as described above is repeated several times after the trench 106 has been filled with the silicon oxide layer 108 and the silicon nitride layer 103 has been removed, the part of the silicon oxide layer 108 buried in the trench 106 that protrudes from the silicon substrate 101 is isotropically etched with the hydrofluoric acid. When the isotropic etching is thus effected in the silicon oxide layer 108, a depressed part 121 of such a shape as is illustrated in FIG. 2A is formed in the silicon oxide layer 108 which is buried in the trench 106.

Since this depressed part 121 is formed between the element forming area and the element separating area S, the upper edge (shoulder part) of the trench 106 is inevitably exposed through this depressed part 121. When a voltage is applied to the gate electrode 110 which is formed astride the element separating area S, therefore, an electric field E is concentrated in the shoulder part of the edge of the trench 106 as illustrated in FIG. 2B.

Consequently, the leak current is made to flow readily through the silicon substrate 101 approximating closely to the shoulder part of the trench 106 even when the gate voltage is low. That is to say, a state equivalent to what is produced when a parasitic transistor of a low threshold is formed is assumed, with the result that the MOS transistor will manifest such characteristics as are illustrated in FIG. 3.

To show the results of the determination of the transistor characteristics, the n type MOS transistor acquires such transistor characteristics as illustrated in FIG. 4A and the p type MOS transistor such transistor characteristics as illustrated in FIG. 5A. These characteristics resemble those illustrated in FIG. 14. The characteristic curves of FIG. 4A and FIG. 5A are found to have such changes as are illustrated in FIG. 4B and FIG. 4B. The small peaks appearing in these changes indicate the changes on the borderline between the characteristic curve of the parasitic transistor illustrated in FIG. 14 and the characteristic curve of the standard transistor. Incidentally, the gate electrodes of FIG. 4A and FIG. 5A have sizes such that the ratio of gate length/gate width is $\frac{1}{10}$.

The phenomenon in which the threshold voltage is lowered by the parasitic MOS transistor as described above is referred to as "hump."

The method of injecting ions into the shoulder part of the trench 106 for the purpose of allaying the leak current of the parasitic transistor is proposed in B. Davari et al., IEDM, 1988, pp. 92–95. This method, however, inevitably narrows the element forming area because the impurity is diffused not only in the shoulder part of the trench 106 but also in the neighborhood thereof.

Another method has been proposed which comprises rounding the shoulder part of the trench 106 by thermal oxidation thereby allaying the concentration of electric field in the relevant part. In order for the shoulder part of the trench 106 to be rounded, the thermal oxidation must proceed at a temperature approximating closely to 1200° C. At this high temperature, the semiconductor wafer of a large diameter is liable to warp.

Yet another method which comprises using a polycrystalline silicon layer as a stopper layer against CMP and RIE and eventually utilizing this polycrystalline silicon layer per se as a gate electrode was published at C. Chen et al., IEDM 1996 PP.837–840. Since this method requires the ion injection of an impurity for the formation of a well to be performed through the gate electrode and the gate oxide layer, it inevitably exposes the gate oxide layer to damage.

Besides, a method which comprises forming insulating side walls on the lateral surfaces of the silicon oxide layer 108 illustrated in FIG. 1E which protrude from the silicon substrate 101 and enabling the insulating side walls to bury the depressed part 121 is disclosed in Pierre C. Fazan et al., Iedm, 1993, PP. 57–60. This method, however, does not easily form the side walls in a perfectly controlled state because it is required to repress the dispersion of the growth of the insulating layer and the dispersion of the erosion of the insulating layer by etching. Further, since the erosion by etching for the formation of the side walls is carried out before the formation of the gate oxide layer, it is suspected that the projection of ions during the erosion coarsens the surface of the silicon substrate and exerts an adverse effect on the gate oxide layer.

SUMMARY OF THE INVENTION

The object of this invention is to provide a method for the production of a semiconductor device which acquires perfect transistor characteristics and precludes the defects inherent in a semiconductor wafer.

In accordance with the present invention, when an element separating trench formed in a semiconducting substrate is filled with an oxide film, the oxide film which protrudes upward from the trench and spreads out is allowed to have a width greater than the element separating trench.

Even when the oxide film on the surface of the substrate is subsequently given an etching treatment intended to contract the oxide film, therefore, the supply of the etchant toward the interior of the trench is obstructed by the protruding part of the oxide film. As a result, the formation of a depressed part in the oxide film within the trench is prevented and the electric field generated from the electrode lying astride the element separating trench is no longer suffered to concentrate in the shoulders of the trench.

The opening part of the stopper layer is dilated uniformly by forming thereon a mask layer of a substance such as silicon dioxide, interposing the stopper layer between this mask layer and the substrate, and isotropically etching selectively the stopper layer in the lateral direction. This selective etching may be implemented wet or dry. When the stopper layer to be used happens to be formed of silicon nitride, the mask layer is formed of silicon oxide and the stopper layer is isotropically and selectively etched wet with phosphoric acid or dry with an arbitrary combination of the gases of $CF_4$, $CHF_3$, HBr, and Ar.

Incidentally, for the sake of protecting the semiconducting substrate exposed from the trench against erosion by etching or pollution, the inner surface of the trench is preferred to be covered with a protecting layer formed of silicon oxide, for example.

DESCRIPTION OF THE PREFERRED EMBODIMENTS

Now, preferred embodiments of this invention will be described below with reference to the accompanying drawings.

FIG. 6A–FIG. 6I are cross sections illustrating one working example of the process for the production of a semiconductor device of this invention.

Figure 6A:
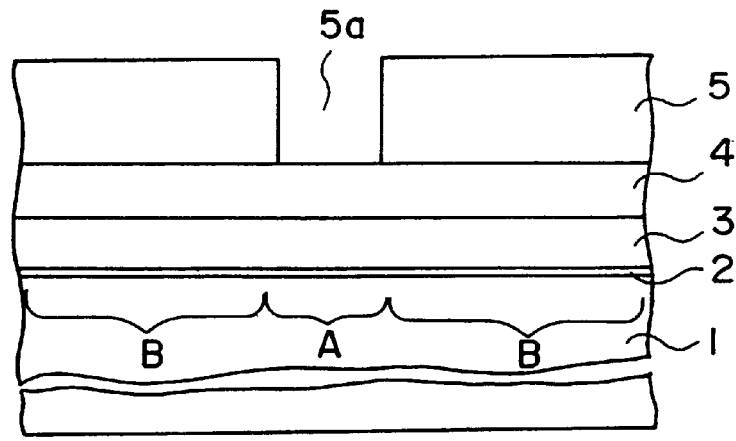
FIG. 6A–6I are cross sections illustrating one working example of the process for the production of a semiconductor device of this invention.

To begin with, the flow of operation which gives rise to the state illustrated in FIG. 6A will be described.

As the first step, the main surface of a silicon substrate (semiconducting substrate) 1 is thermally oxidized to form on the main surface a first silicon oxide layer (substrate protecting layer) 2, 10 nm in thickness. Subsequently, a silicon nitride layer (stopper layer) 3 is formed on the first silicon oxide layer 2 by the CVD technique and a second silicon oxide layer (mask layer) 4 is further grown in a thickness of 100 nm on the silicon nitride layer 3 by the CVD technique. The silicon nitride layer is preferred to have a thickness of not less than 40 nm and not more than 1.2 times the thickness of a gate electrode member which will be specifically described herein below. This thickness will be described in detail herein below.

Thereafter, a resist (mask layer) 5 is spread on the second silicon oxide layer 4 and it is exposed and developed to form a window 5a in an element separating area A. The width of the window 5a in the element separating area A is not more than 1 µm, for example, and it decreases to or below 0.2 µm in proportion as the miniaturization of the semiconductor element advances.

Figure 6B:
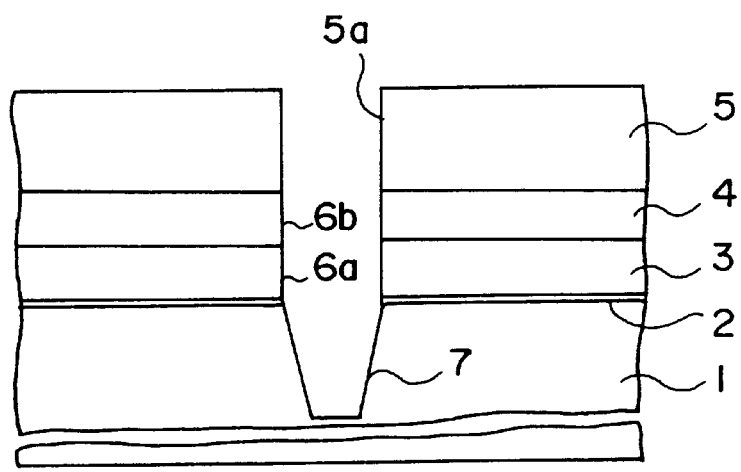

Next, the second silicon oxide layer 4 and the silicon nitride layer 3 are etched through the window 5a to form opening parts 6a and 6b under the window 5a as illustrated in FIG. 6B. Subsequently, the silicon substrate 1 is etched through the window 5a and the opening parts 6a and 6b to form a trench 7, 0.5 µm in depth. In this case, a mixed gas of $CF_4$ and $CHF_3$ and Ar is used as the gas for etching the first and second silicon oxide layers 2 and 4 and the silicon nitride layer 3. A mixed gas of HBr and $O_2$ or a mixed gas of $Cl_2$ and $O_2$ is used as the gas for etching the silicon substrate 1 to slant the lateral surfaces of the trench 7 and, by virtue of this slant, alleviate the concentration of an electric field on the shoulder part (upper edge) of the trench 7. The second silicon oxide layer 4 is formed at a temperature in the approximate range of 750–800° C., for example.

Figure 6C:
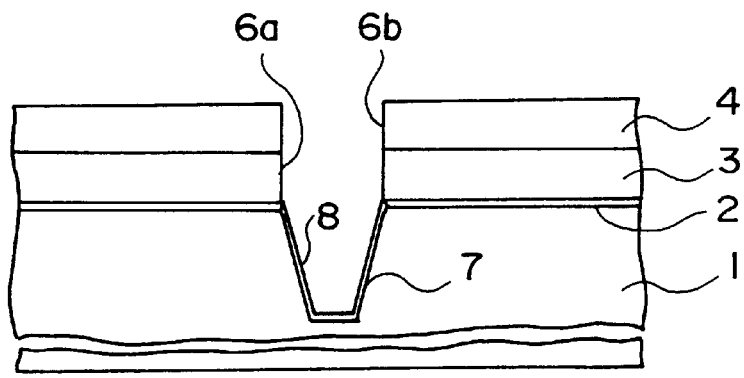
Figure 6D:
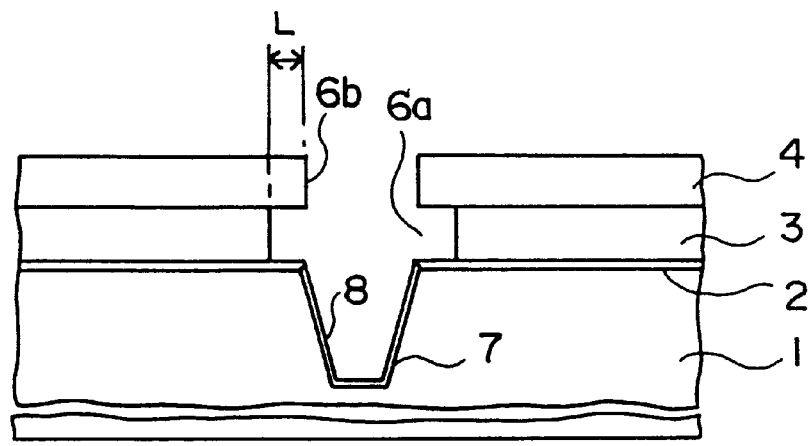

Next, the resist 5 is removed with a solvent and then, as illustrated in FIG. 6C, the inner wall surface of the trench 7 of the silicon substrate 1 is thermally oxidized to grow a third silicon oxide layer (substrate protecting layer) 8, 5 nm in thickness, and cover the inner surface of the trench 7 with the third silicon oxide layer 8. Subsequently, the silicon nitride layer 3 interposed between the first silicon oxide layer 2 and the second silicon oxide layer 4 is laterally etched to dilate the opening part 6a in the silicon nitride layer 3 by about 50 nm as illustrated in FIG. 6D. In this case, since the first and second silicon oxide layers 2 and 4 are etched only sparingly with hot phosphoric acid, the second silicon oxide layer 4 assumes a state of overhanging from the silicon nitride layer 3 in the opening part 6b and, what is more, the surface of the silicon substrate 1 exposed through the trench 7 is protected against the hot phosphoric acid by the third silicon oxide layer 8.

The etching of the silicon nitride layer 3 may be effected wet with hot phosphoric acid or dry with a gas arbitrarily selected from among $CF_4$, $CHF_3$, HBr, and Ar.

Figure 6E:
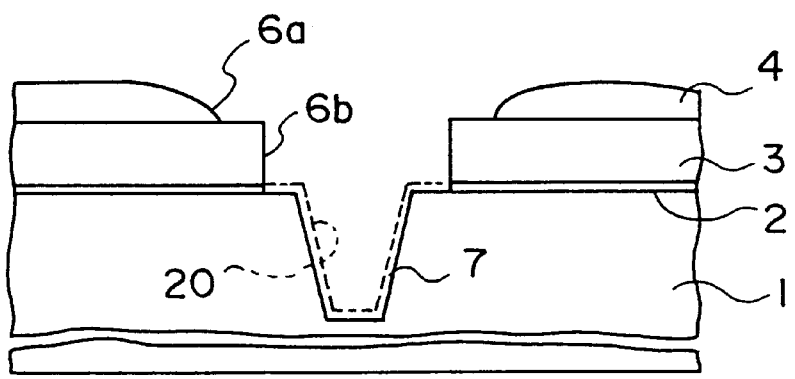

Thereafter, the first, second, and third silicon oxide layers 2, 4, and 8 are etched with a dilute aqueous hydrofluoric acid solution to remove the first and second silicon oxide layers 2 and 4 exposed through the opening parts 6a and 6b and, at the same time, remove the overhanging part of the third silicon oxide layer relative to the silicon nitride layer 3 as illustrated in FIG. 6E. The amount of the etching of the third silicon oxide layer 8 in the lateral direction is not less than 50 nm. In this case, the isotropic etching performed on the second silicon oxide layer 4 results in dilating the opening part 6b to a size larger than the opening part 6a of the silicon nitride layer 3 and, at the same time, smoothing the angles along the edge of the second silicon oxide layer 4.

Figure 6F:
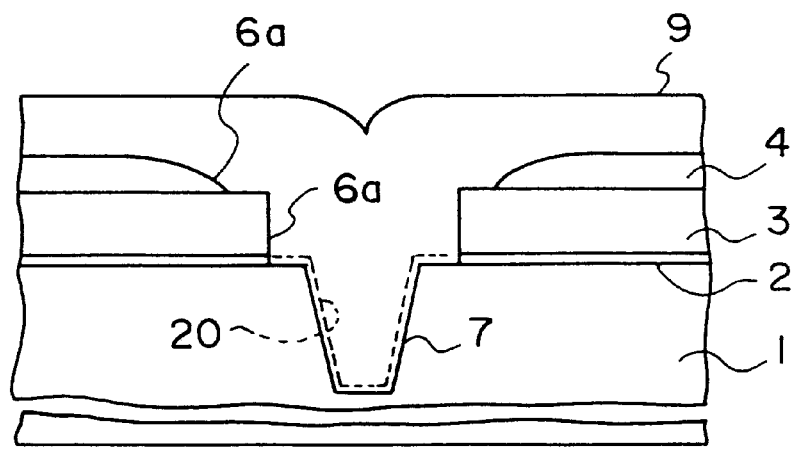

Next, a fourth silicon oxide layer 9 is grown in a thickness in the approximate range of 0.6–1.0 µm by the CVD technique so that the fourth silicon oxide layer 9 covers the silicon nitride layer 3 and the third silicon oxide layer 4 and, at the same time, fills the interior of the trench as illustrated in FIG. 6F. A mixed gas of $SiH_4$ and oxygen or a mixed gas of TEOS and ozone is used for the CVD. After the fourth silicon oxide layer 9 has been grown as described above, it is annealed at about 1000° C. to densify the interior of the fourth silicon oxide layer 9.

Subsequently, the fourth silicon oxide layer 9 and the third silicon oxide layer 4 are polished by the CMP technique to remove the third and fourth silicon oxide layers 4 and 9 which overlie the silicon nitride layer 3.

This polishing is implemented with the silicon substrate 1 interposed between the upper and lower discs (not shown) which are kept in motion. The rotating speeds of the upper and lower discs are each fixed at 20 rpm, the pressure between the upper and lower discs is fixed at 5 psi, the back pressure is fixed at 5 psi, and the abrasive to be used is a slurry formed mainly of colloidal silica or a cerium oxide type slurry. Under these conditions, the etching rate of the silicon nitride layer 3 is small and this etching constitutes itself the end point of the polishing. In the state at the end of this polishing, the fourth silicon oxide layer 9 remains exclusively in the opening part 6a of the silicon nitride layer 3 and the trench 7.

Next, when the silicon nitride layer 3 is removed with a hot aqueous phosphoric acid solution, part of the fourth silicon oxide layer 9 filling the trench 7 appears as a protuberance 9a on the silicon substrate 1 and this protuberance 7a assumes a state of protruding from the element separating area A and spreading over the element forming area B.

Thereafter, the first silicon oxide layer 2 remaining on the silicon substrate 1 is removed with a dilute aqueous hydrofluoric acid solution, the surface of the silicon substrate 1 is thermally oxidized to grow a sacrificing oxide layer (not shown), the silicon substrate 1 is subjected to ion injection to form a single conduction type well 10, and then the sacrificing oxide layer is removed with a diluted aqueous hydrofluoric acid solution.

In consequence of the two rounds of the treatment with hydrochloric acid which is performed as described above, the protuberance 9a of the fourth silicon oxide layer 9 is contracted until the amount of protrusion α, thereof into the element forming area B decreases or ceases to exist and, at the same time, the shoulder part of the protuberance 9a is rounded.

Since the supply of the etchant to the silicon oxide layer 9 in the trench 7 is consequently obstructed, the silicon oxide layer 9 existing in and on the trench 7 will not suffer such formation of a depressed part as has been heretofore incurred. The amount of protrusion a, of the protuberance 9a into the element forming area B is adjusted by surveying in advance the amount of the silicon nitride layer 3 to be etched laterally as illustrated in FIG. 6D and the amount of the protuberance 9a to be contracted with hydrofluoric acid, and causing the outer edge of the protuberance 9a either to coincide with the upper edge of the trench 7 or to spread out slightly into the element forming area B by several nm after the removal of the sacrificing oxide layer. This adjustment can be effected as perfectly controlled. As a result, the element separating structure is completed by the fourth silicon oxide layer 9 buried in the trench 7.

Figure 7:
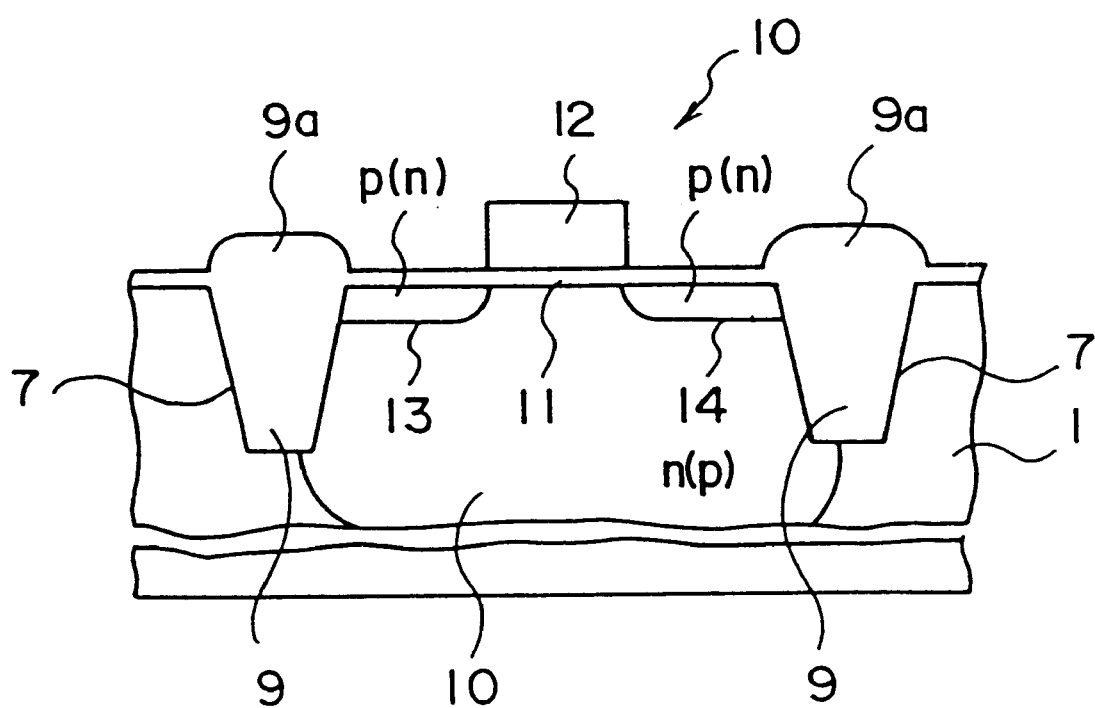
FIG. 7 is a cross section illustrating a MOS transistor formed through one working example of the process for the production of the semiconductor device of this invention.

Next, the surface of the silicon substrate 1 is thermally oxidized to form a gate oxide layer (gate insulating layer) 11, 5 nm in thickness, then a gate electrode 12 is formed as extended from the element forming area B through the element separating area A, and subsequently impurity diffused layers 13 and 14 destined to give rise to a source and a drain are formed by ion injecting an impurity of a conductivity opposite that of the impurity in the silicon substrate 1 into the opposite sides of the gate electrode 12. As a result, the step for the formation of the MOS transistor illustrated in FIG. 7 is completed.

The impurity to be ion injected into the silicon substrate 1 for the purpose of forming the impurity diffused layers 13 and 14 is a p type impurity (such as boron) when the well 10 is an n type or an n type impurity (such as phosphorus or arsenic) when the well 10 is a p type.

Figure 8A:
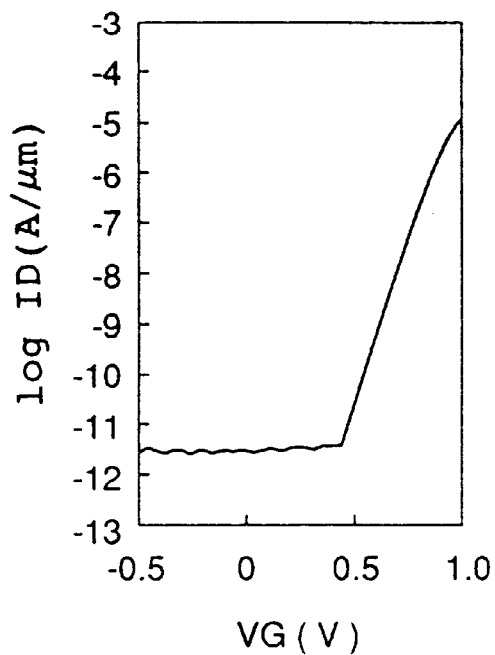
FIG. 8A is a transistor characteristic diagram showing the relation between the gate voltage and the drain current obtained of an n type MOS transistor formed by one working example of this invention and FIG. 8B is a diagram showing the change in the log ID relative to the gate voltage of FIG. 8A.
Figure 8B:
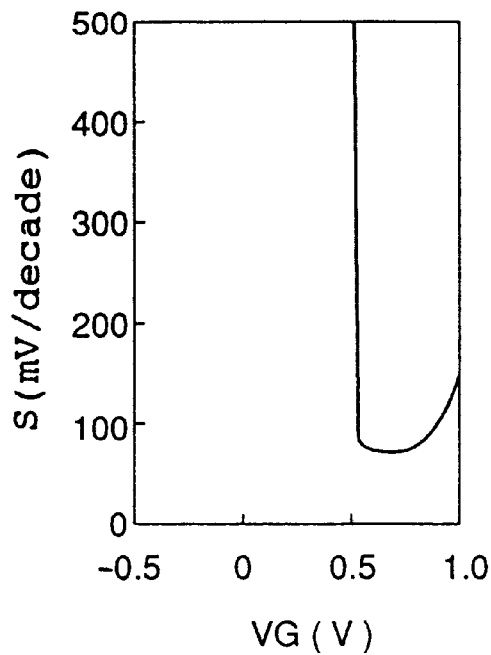
Figure 9A:
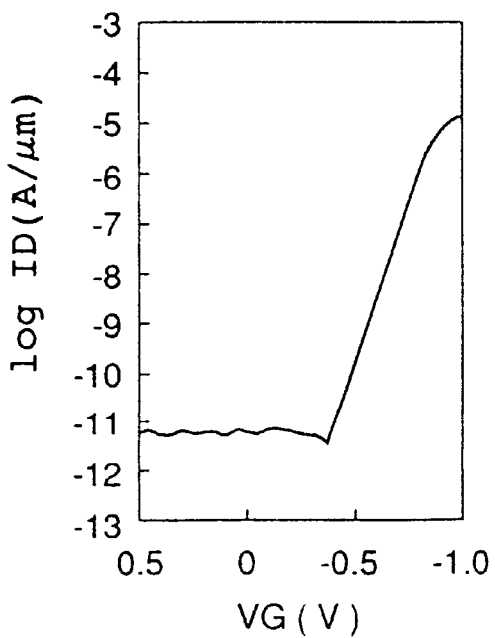
FIG. 9A is a transistor characteristic diagram showing the relation between the gate voltage and the drain current obtained of a p type MOS transistor formed by one working example of this invention and FIG. 9B is a diagram showing the change in the log ID relative to the gate voltage of FIG. 9A.
Figure 9B:
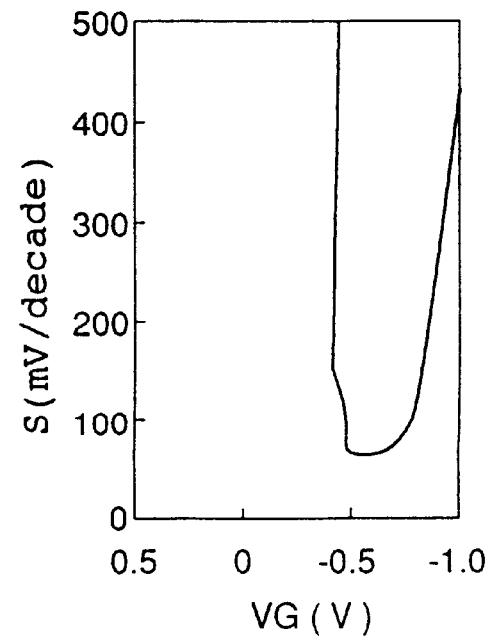

When the n type MOS transistor formed by the step described above was tested for transistor characteristic, the presence of a parasitic MOS transistor therein was confirmed as clearly noted from the results of this test shown in FIG. 8A. Specifically, it is clear from the transistor characteristic curve shown in FIG. 8A that no peak showing a conspicuous change was present and substantially no decline in the threshold voltage was in sight. When the p type MOS transistor was also tested for transistor characteristics, the results of the test were as shown in FIG. 9B. The change in the transistor characteristic curve shown in FIG. 9B does not support the presence of a discernible parasitic capacity. The sizes of the gate electrodes 12 in FIG. 8A and FIG. 9A were such that the ratio of gate length/gate width was 1/10.

Figure 10:
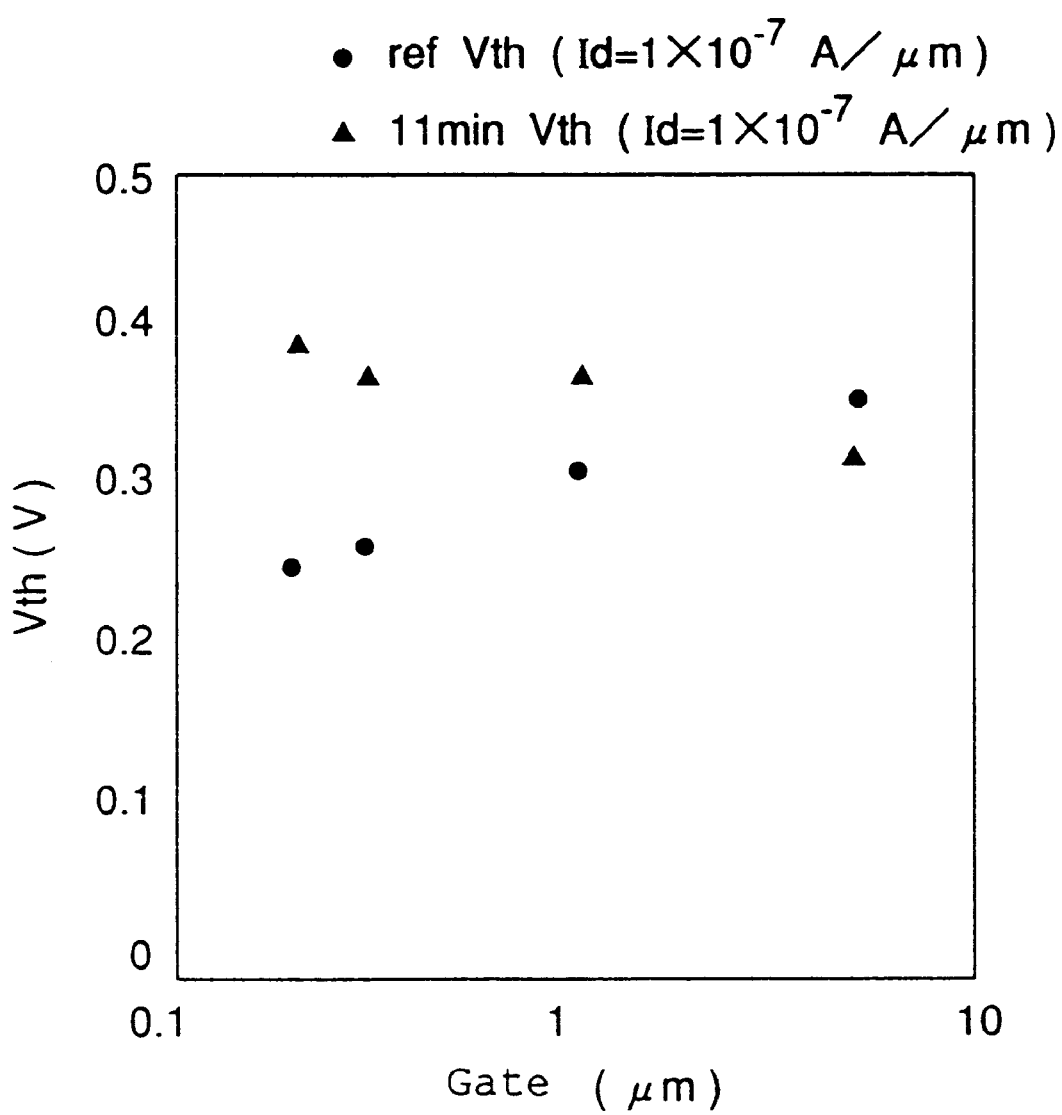
FIG. 10 is a characteristic diagram illustrating the inverse nip channel effects respectively of the MOS transistor formed by one working example of this invention and the MOS transistor formed by the conventional process.
Figure 11:
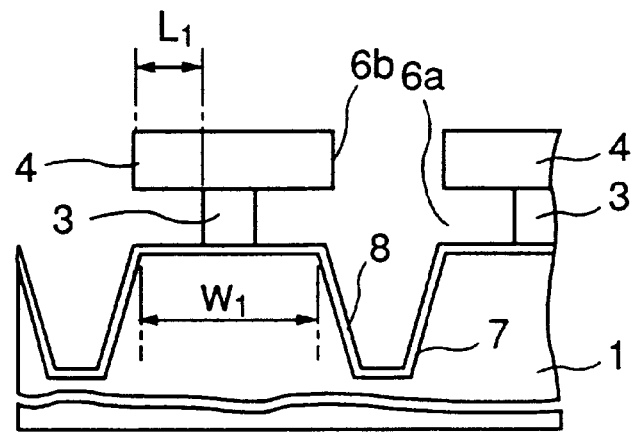
FIG. 11 is a cross section to aid in the description of the optimization of dry etching of a silicon nitride layer used as a mask in one working example of this invention.

When the MOS transistors were tested for inverse nip channel effect, the results were as shown in FIG. 10. To be specific, the samples of the MOS transistor formed by the process of the working example described above were tested for change in the threshold voltage ($V_{th}$) relative to the change in the width of the gate electrode (namely the length of the gate electrode in the direction perpendicular to the direction of length of the channel), the change in the gate width brought about virtually no change in the threshold voltage as shown in the triangular plot of FIG. 7. In this case, the time for the treatment of the protuberance 91 with hydrofluoric acid was fixed at 11 minutes and the lateral parts of the protuberance 9a were made to coincide substantially with the upper edges of the trench 7.

Figure 1A:
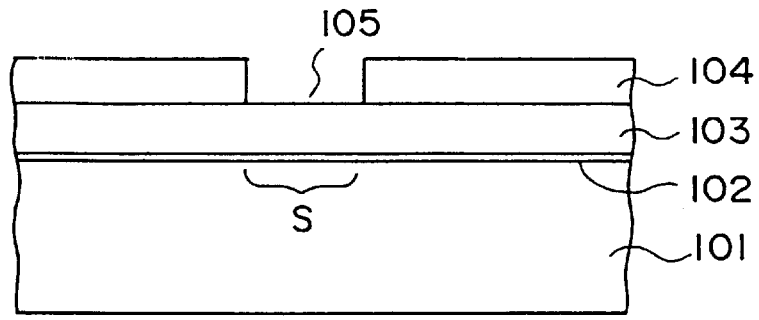
FIGS. 1A–1F are cross sections illustrating one example of the process for the production of a conventional semiconductor device.
Figure 1B:
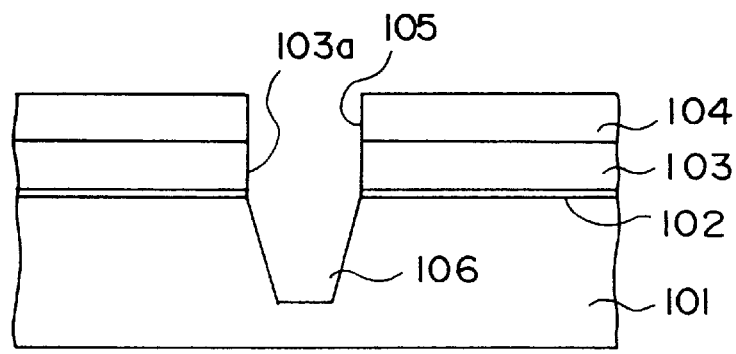
Figure 1C:
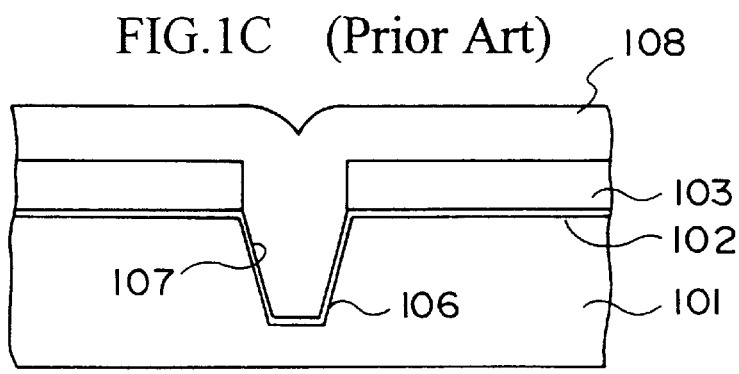
Figure 1D:
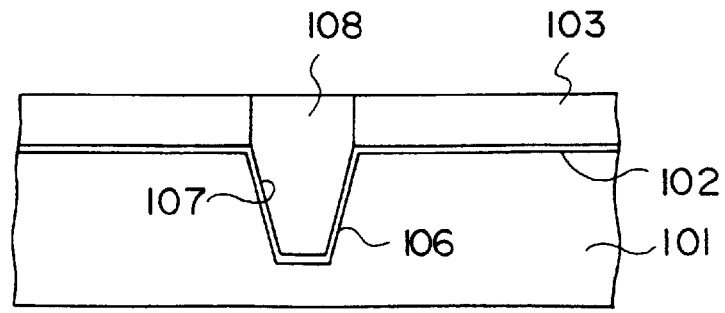
Figure 1E:
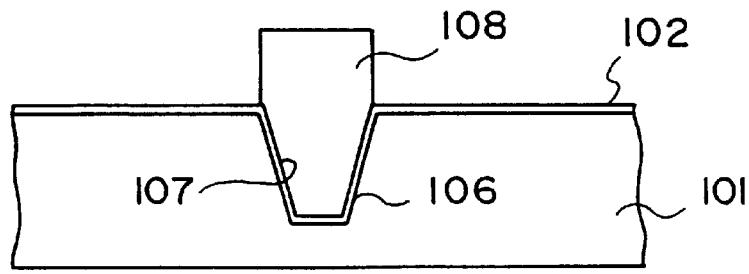
Figure 1F:
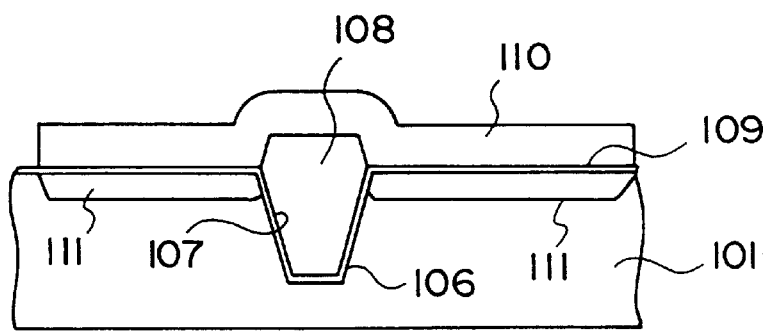
Figure 2A:
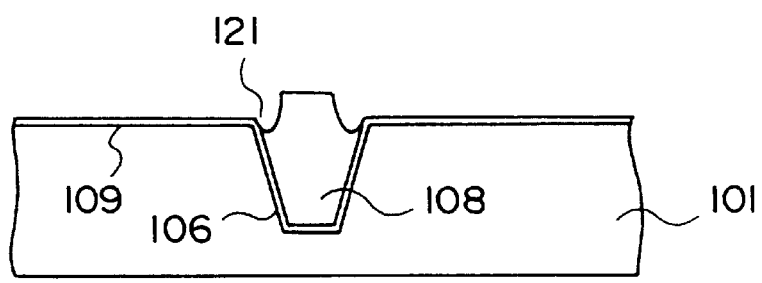
FIGS. 2A and 2B are cross sections illustrating a defect formed in an element separating oxide film in the process for the production of the conventional semiconductor device.
Figure 2B:
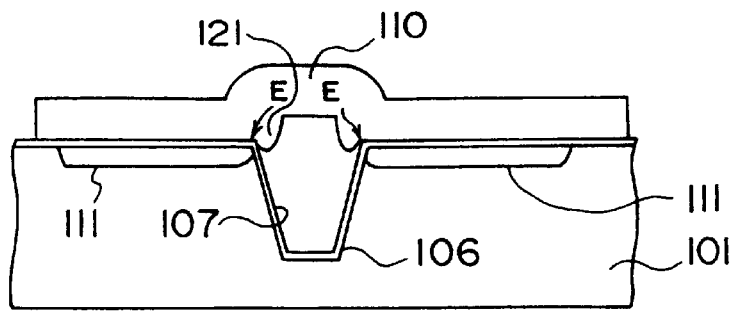
Figure 3:
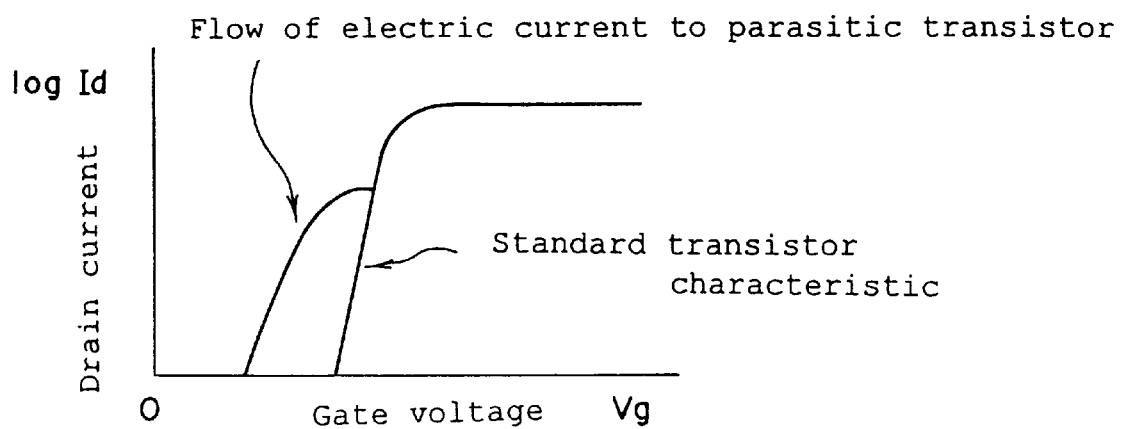
FIG. 3 is a transistor characteristic diagram of an MOS transistor shown in FIG. 2B.
Figure 4A:
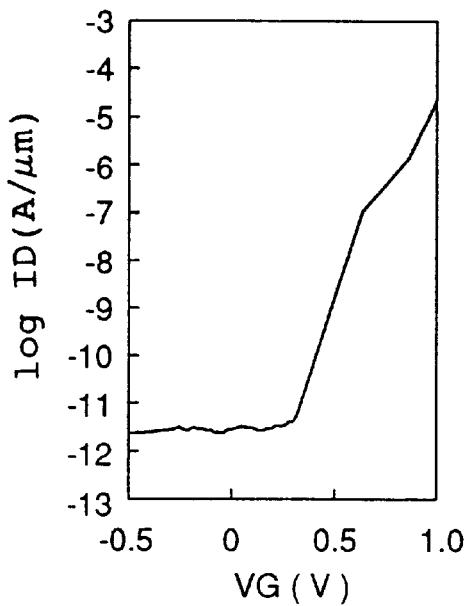
FIG. 4A is a transistor characteristic diagram showing the relation between the gate voltage and the drain current obtained of an n type MOS transistor formed by the conventional step and FIG. 4B is a diagram showing the change in the log ID relative to the gate voltage of FIG. 4A.
Figure 4B:
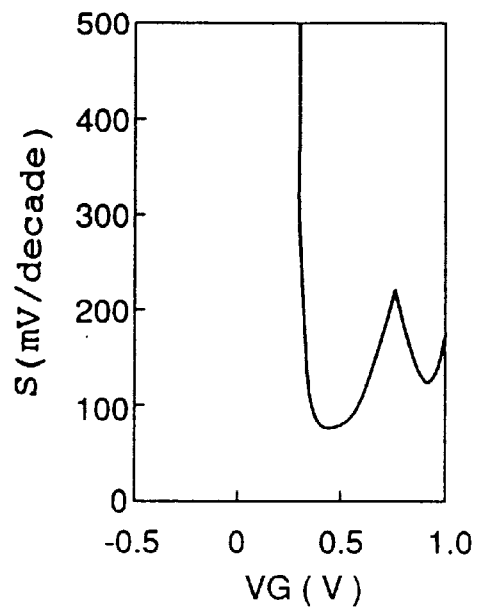
Figure 5A:
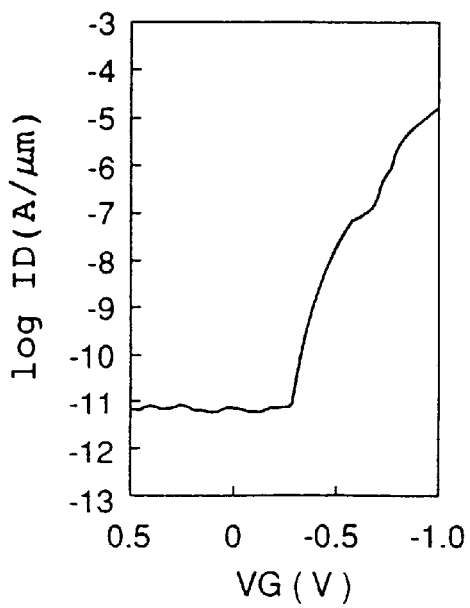
FIG. 5A is a transistor characteristic diagram showing the relation between the gate voltage and the drain current obtained of a p type MOS transistor formed by the conventional step and FIG. 5B is a diagram showing the change in the log ID relative to the gate voltage of FIG. 5A.
Figure 5B:
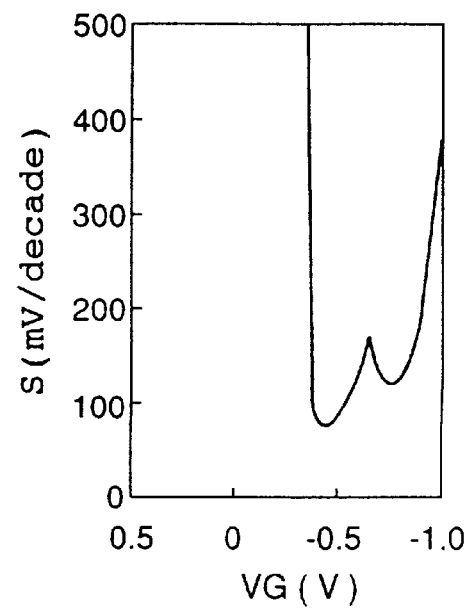

In contrast, when the samples of the MOS transistor of the structure produced by the conventional method as shown in FIG. 2B were tested for change in the threshold voltage ($V_{th}$) relative to the change in the gate width, it was found that the threshold voltages decreased in accordance as the gate widths decreased as shown in the full circle plot of FIG. 10. The results may be logically explained by supposing that the effect of the parasitic capacity accounted for a large proportion in the transistor characteristics.

Incidentally, the tolerance, L, of side etching to be involved when the silicon nitride layer 3 is laterally etched as illustrated in FIG. 6D gains in significance in accordance as the width of the area in which the transistor is formed (otherwise referred to as "active area") decreases. This tolerance, L, is decided as follows.

Prior to the formation of the gate oxide layer 11, the thermal oxide film is treated with hydrofluoric acid to an extent of etching this film in a depth of about 20 nm. The fourth silicon oxide layer 9 in the trench 7, after the annealing treatment, assumes a film quality substantially equal to that of the thermal oxide film.

The width of the protuberance 9a is to need wider than the width of the trench 7 after the treatment of hydrofluoric acid. In order to prevent this minimization of the protuberance 9a, it is necessary that the protuberance 9a secure in advance a large width by allowing the opposite sides of the opening part 6a of the silicon nitride layer 3 each to have a width of not less than 20 nm from the trench 7. If the width of the active area in which the MOS transistor is formed is narrowed and the width of the opening part 6a is unduly widened, the width of the silicon nitride layer 3 will be unduly small and the second silicon oxide layer 4 will possibly lift off. This adverse phenomenon must be prevented. There are indications that the second silicon oxide layer 4 does not lift off so long as the amount of etching in the lateral direction is 45% of the smallest allowable width of the active area. When the minimum width $W_1$ of the active area is 200 nm, for example, the largest allowable value of the amount $L_1$ of the lateral etching of the silicon nitride layer 3 through the opening 6a is 90 nm.

As respects the amount of lateral etching, the amount of the lateral etching of the silicon nitride layer 3 is in the range of 20–90 nm when the minimum width $W_1$ of the active area is 200 nm or in the range of 20–81 nm when the minimum width of the active area is 180 nm.

Next, the thickness of the silicon nitride layer 3 that decides the height of the protuberance 9a will be described.

Figure 6G:
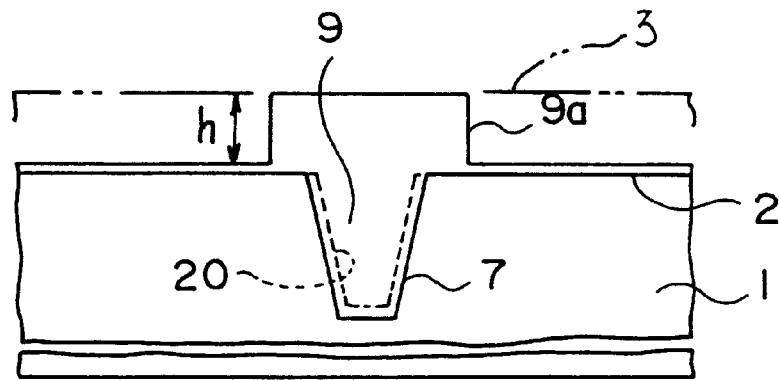
Figure 6H:
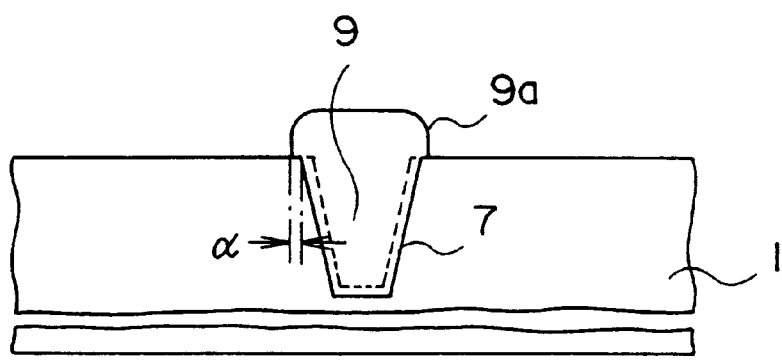
Figure 6I:
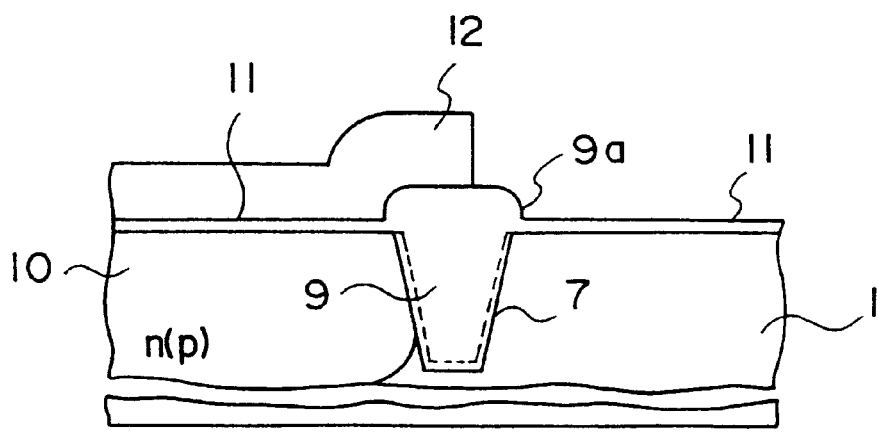
Figure 12:
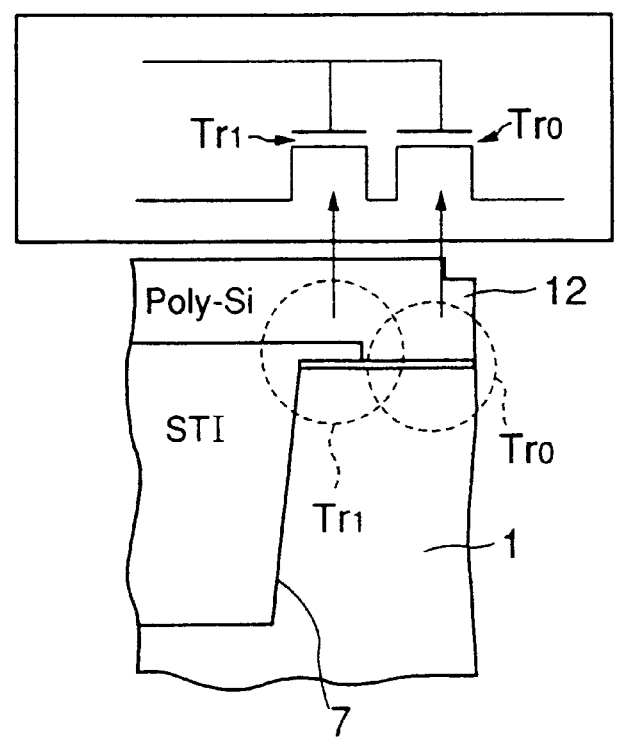
FIG. 12 is a cross section illustrating a MOS transistor formed in an element area in one working example of the present invention and a parasitic transistor formed on the upper edge of a trench in the element separating area and an equivalent circuit diagram of the corresponding transistor.

When the height, h, of the protuberance 9a which is decided by the thickness of the silicon nitride layer 3 is unduly small as illustrated in FIG. 6G, the parasitic MOS transistor $Tr_1$ which is formed on and near the upper edge (shoulder) of the trench 7 as illustrated in FIG. 12 is readily turned ON. This parasitic MOS transistor $Tr_1$ forms a cause for producing a hump. The symbol $Tr_0$ used in FIG. 9 represents a proper MOS transistor.

The lower limit of the range for the height h of the protuberance 9a which prevents the parasitic transistor $Tr_1$ from turning ON is about 40 nm when the voltage of the power source is 1.8 V. The threshold $V_{th}$ is decided by the following formula.

$$V_{th}=V_{fb}+2\phi F+\sqrt{2\epsilon_{si}\cdot q\cdot NA\cdot 2\phi F}\times 1/C_{ox} \quad (1)$$

wherein $V_{fb}$ represents the flat band voltage $\phi F$ the Fermi potential $\epsilon_{si}$ the dielectric constant of silicon, q the elementary electric charge (in C), and NA the concentration of an impurity in the substrate. Then, $C_{ox}$ represents the magnitude of this expression, $C_{ox}=\epsilon_{ox}/D$, wherein $\epsilon_{ox}$ represents the dielectric constant of silicon oxide and d the thickness of a gate oxide layer expressed in cm. The following relations also exist.

$$\epsilon_{si}=11.7\epsilon_o$$

$$\epsilon_{ox}=3.9\epsilon_o$$

$$\phi F=k\cdot In(NA/ni)$$

wherein $\epsilon_0$ (dielectric constant of vacuum)=$8.854\times10^{-14}$ (F/cm), k=$8.62\times10^{-5}$, ni=$1.45\times10^{10}$ and q=$1.6\times10^{-19}$ C. The term $V_{th}$ in the formula (1) is given as follows when T (absolute temperature)=300 K, $V_{th}$=1.054 V, and d=$40\times10^{-7}$ cm.

$$V_{th}=1.756 \text{ kg}^{-1}\cdot\text{m}^{-2}\cdot\text{sec}^2\cdot\text{coul}\cdot\text{volt}$$

The component terms defining the threshold $V_{th}$ and excepting $C_{ox}$ are constants that are invariably decided on the substrate side. In the light of the influence of this threshold, the parasitic capacity MOS transistor to be produced inevitably has a deep (small) threshold voltage when the amount of the protrusion of the protuberance 9a from the substrate is small. Under the conditions mentioned above, it may be concluded that the thickness of the silicon nitride layer 3 is preferred to be not less than 40 nm because the threshold of the parasitic MOS transistor $Tr_1$ is 1.8 V when the amount of protrusion is 40 nm.

In contrast, the largest allowable amount of protrusion is decided by the depletion ratio of the parasitic MOS transistor $Tr_1$ or the thickness of the gate electrode.

Figure 13A:
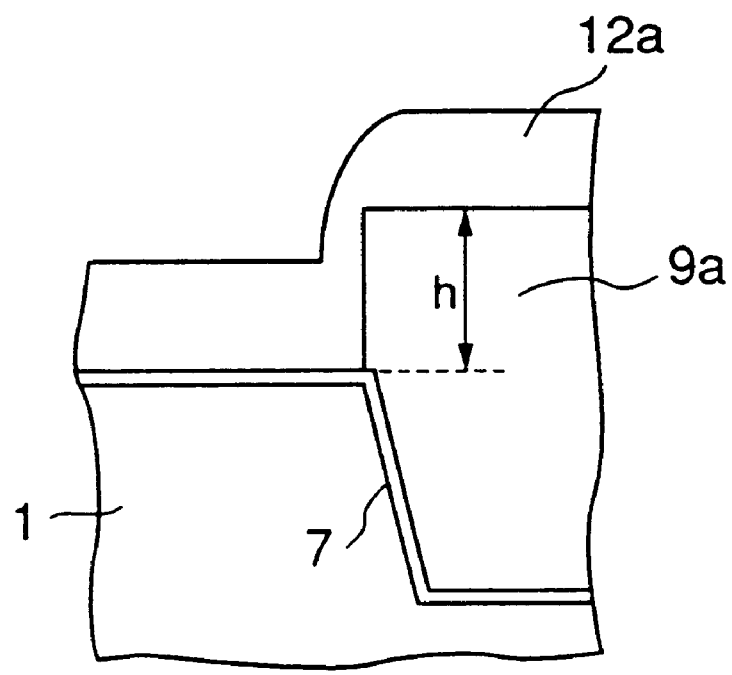
FIGS. 13A and 13B are cross sections showing the relation between the height of a protuberance of a silicon oxide film formed in and on the trench of the element separating area and the thickness of a polycrystalline silicon film forming a gate electrode.
Figure 13B:
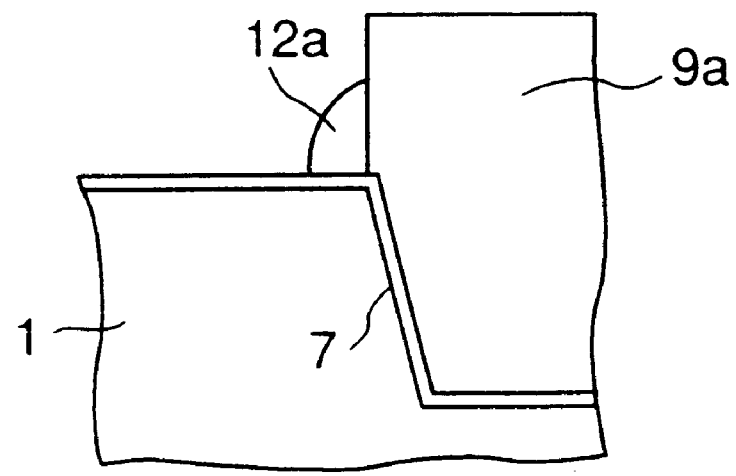

If the amount of protrusion of the protuberance 9a is unduly large, for example, the silicon substrate 1, during the formation of the gate electrode 12, suffers a depressed part to be formed in the active area thereof. Specifically, in order to form the gate electrode 12, it is necessary that a polycrystalline silicon layer 12a doped with an impurity be formed so as to cover the protuberance 9a and then this polycrystalline silicon layer 12a be patterned as illustrated in FIG. 13A. To attain thorough removal of the part of the polycrystalline silicon layer 12a not forming the pattern of the gate electrode 12 that remains on the lateral surfaces of the protuberance 9a as illustrated in FIG. 13B, however, an overetching time is required for the sake of removing what remains after deducting the thickness of the polycrystalline silicon film 12a from the height of the protuberance 9a. Since this overetching additionally affects the gate oxide layer 11 on the lateral side of the gate electrode 12 extraneously, it becomes necessary to prevent the silicon substrate 1 from the etching which would arise thereafter. For the purpose of this prevention, it is appropriate for the height, h, of the protuberance 9a to be about 1.2 times the height of polycrystalline silicon film 12a which is destined to for the gate electrode 12. For example, it is proper to fix the upper limit of the height h of the protuberance 9a at 2400 nm when the thickness of the gate electrode 12 is set at 200 nm or at 216 nm when the thickness of the gate electrode 12 is set at 180 nm.

Though the fourth silicon oxide layer 9 taking part in the construction of the element separating structure, as depicted above, relies on the CMP to effect the removal thereof from the silicon nitride layer 3, the RIE which uses a mixed gas of $CF_4$ and $CHF_3$ may be adopted instead.

Though the third silicon oxide layer 4 overlying the silicon nitride layer 3 is intended to be used as a mask when the trench 7 is formed by etching the silicon substrate 1, a resist layer may be used alternatively. In this case, the growth of the third silicon oxide layer 4 on the silicon nitride layer 3 may be omitted.

It is further permissible to have a fifth silicon oxide layer (substrate protecting layer) 20 formed as illustrated in FIG. 2B along the inner wall surface of the trench prior to the formation of the fourth silicon oxide layer 9.

In accordance with this invention, when the element separating trench formed in the semiconducting substrate is filled with an oxide film, the range in which the oxide film is allowed to protrude from and spread out of the semiconducting substrate is set to exceed the width of the trench by dilating the opening part of the stop layer. As a result, even when such an etching treatment as contracts the oxide film on the surface of the substrate is subsequently performed, the supply of the etchant toward the interior of the element separating trench is obstructed and, consequently, the otherwise possible formation of a depressed part in the oxide film existing in and on the trench is prevented.

What is claimed is:

1. A method for the production of a semiconductor device, comprising the steps of:

forming a stopper layer over a semiconducting substrate, forming a first opening part in said stopper layer thereby enabling said first opening part to establish an element separating area;

etching said semiconducting substrate through said first opening part thereby forming a trench in said semiconducting substrate;

partially etching a portion of said stopper layer in close proximity to said trench thereby dilating the width of said first of said first opening part;

forming an oxide film on said stopper layer; in said first opening part, and inside said trench, removing the part of said oxide film rising above said stopper layer; and removing said stopper layer, and contracting the lateral parts of said oxide film protruding from said trench.

2. A method according to claim 1, wherein said formation of an oxide film consists in forming a silicon oxide film and said oxide film protruding from said semiconducting substrate is contracted with hydrofluoric acid.

3. A method according to claim 2, wherein the width to which said first opening part is dilated at said step for dilating said first opening part is greater than the width to which said oxide film is contracted with said hydrofluoric acid.

4. A method according to claim 1, wherein the removal of said oxide film on said stopper layer is effected by polishing or anisotropic etching.

5. A method according to claim 1, which further comprises a step of forming a mask layer on said stopper layer prior to the formation of said first opening part in said stopper layer and then forming a second opening part in said mask layer on an area intended as a prospective site for the formation of said first opening part and a step of dilating said first opening part in said stopper layer thereby causing said mask layer to overhang said first opening part.

6. A method according to claim 5, which further comprises a step of removing said mask layer subsequently to the dilation of said first opening part.

7. A method according to claim 5, wherein said second opening part in said mask layer is dilated to a size equal to or greater than said first opening subsequently to the dilation of said first opening part.

8. A method according to claim 5, wherein said stopper layer is formed by the growth of silicon nitride, said mask layer is formed by the growth of silicon oxide or the application of resist, the dilation of said first opening part in said stopper layer is effected by selective etching of said stopper layer relative to silicon oxide, and said oxide film is formed by the growth of silicon oxide.

9. A method according to claim 8, wherein the dilation of said first opening part is effected by dry etching with an arbitrary combination of $CF_4$, $CHF_3$, HBr, and Ar gases.

10. A method according to claim 8, wherein the dilation of said first opening part is effected by wet etching with an aqueous phosphoric acid solution.

11. A method according to claim 1, which further comprises a step of forming a substrate protecting layer between said stopper layer and said semiconducting substrate.

12. A method according to claim 11, wherein the formation of said substrate protecting layer, on condition that said semiconducting substrate is a silicon substrate, consists in thermally oxidizing the surface of said silicon substrate thereby forming a silicon dioxide layer.

13. A method according to claim 1, wherein said stopper layer is formed by the growth of silicon nitride and said oxide film is formed by the growth of silicon oxide.

14. A method according to claim 1, which further comprises a step of forming a substrate protecting layer on the inner wall of said trench subsequently to the formation of said trench and prior to the dilation of said first opening part.

15. A method according to claim 1, which further comprises a step of forming a substrate protecting layer on the inner wall of said trench prior to the formation of said oxide film in said trench.

16. A method according to claim 1, wherein the thickness of said stopper layer is not more than 1.2 times the thickness of an electrode to be formed astride said oxide film protruding from said trench.

* * * * *